United States Patent

Nakajima et al.

[11] Patent Number: 5,571,367
[45] Date of Patent: Nov. 5, 1996

[54] APPARATUS FOR SUBJECTING A SEMICONDUCTOR SUBSTRATE TO A WASHING PROCESS

[75] Inventors: Takahito Nakajima; Yuji Fukazawa, both of Yokohama, Japan

[73] Assignee: Kabushiki Kaisha Toshiba, Kawasaka, Japan

[21] Appl. No.: 401,686

[22] Filed: Mar. 10, 1995

[30] Foreign Application Priority Data

Mar. 30, 1994 [JP] Japan ..................................... 6-061432

[51] Int. Cl.⁶ ..................................................... H01L 21/00
[52] U.S. Cl. ..................................................... 156/345
[58] Field of Search ............................ 156/626.1, 657.1, 156/662.1, 345 V, 345, 345 MC, 345 L; 134/3, 114, 902

[56] References Cited

U.S. PATENT DOCUMENTS 4,840,701 6/1989 Stern .................................. 156/345 L Primary Examiner—William Powell
Attorney, Agent, or Firm—Finnegan, Henderson, Farabow, Garrett & Dunner, L.L.P.

[57] ABSTRACT

An apparatus for subjecting a semiconductor substrate to a washing process is equipped with a hermetically closable chamber for a substrate washing process and a washing process bath provided in the chamber to subject the substrate to the washing process. The semiconductor substrate is held in a horizontal state by a substrate support mechanism provided in the substrate washing process bath. A liquid supply mechanism is provided for supplying a liquid at least enough great to allow the semiconductor substrate to be immersed with the liquid. A chemicals liquid vapor and gas for substrate washing are supplied, by a chemicals component supply mechanism, into the chamber for a predetermined time period so that the chemicals liquid vapor and gas are dissolved into the liquid in the process bath to give a solution. The solution thus obtained is replaced by a pure water replacing mechanism with a specific liquid.

7 Claims, 2 Drawing Sheets

APPARATUS FOR SUBJECTING A SEMICONDUCTOR SUBSTRATE TO A WASHING PROCESS

Background of the Invention

1. Field of the Invention

The present invention relates to an apparatus for subjecting a semiconductor substrate to a washing process before a vapor-phase growth film forming step, a diffusion step, etc., of a wafer process in the manufacture of a semiconductor device.

2. Description of the Related Art

FIG. 1 is a view diagrammatically showing a conventional wafer washing apparatus.

A wafer 50, an object of washing, is placed on a wafer support base 58 rotationally driven by an external motor 57. The wafer 50, together with a wafer support base 58, is arranged, in a hermetically sealed state, in a chamber 51 for washing with a chemicals liquid.

Within the chamber 51 above, a vapor supply means 56 is located above the wafer 50. The vapor supply means 56 comprises a substrate washing process bath 53 equipped with an inlet 52 for supplying a chemicals liquid (a hydrofluoric acid, HF), a hot plate 54 for heating the washing process bath, and a vapor supply nozzle section 55.

The washing process chamber 51 is equipped in an upper zone with an inlet 59 for supplying an inert gas, such as an $N_2$ gas, and in a lower zone with a discharge outlet 60.

A water washing/drying chamber 61 is provided in a side-by-side relation to the washing process chamber 51. A water washing process bath 62 is provided in the washing/drying chamber 61 and has a wafer support base 64 mounted therein. The wafer support base 64 is rotationally driven by an external motor 63. A pure water supply nozzle 65, a water discharge outlet 66 and exhaust outlet 67 are provided in the washing/drying chamber 61.

FIG. 2 shows a wafer 50 comprising a semiconductor substrate 50a, an insulating film 50b formed on the semiconductor substrate 50a and a metal wire 50c formed on the insulating film 50b.

When the wafer 50 is to be washed in the above-mentioned apparatus, the wafer is placed in the washing process chamber 51 and an HF vapor is introduced into the chamber 51 placed in a hermetically sealed state. The wafer 50 is exposed to the HF vapor to allow it to be treated with such chemicals vapor.

In the case where metal particles are left on the wafer surface in the previous chemicals-washing step, such metal particles cannot be removed from the wafer surface simply by supplying the HF vapor to the surface of the wafer. In order to remove the metal particles or a hydrofluoric acid HF adsorbed in or on the wafer surface, the wafer 50 which has been processed with the chemicals vapor is conveyed into the washing/drying chamber 61 where it is washed with pure water. There, the water is dried while the wafer is rotated.

It is possible to, instead of supplying the HF vapor, supply a mixture of an HF gas and water vapor.

In the above-mentioned conventional wafer washing apparatus, the two chambers 51 and 61 are prepared, that is, the chamber 51 for an HF process and the chamber 61 for water-washing and drying. This takes up a greater mount space. In addition to this drawback, the apparatus also encounters a possibility of exposing the wafer 50 to an outer atmosphere on conveyance from the HF process chamber 51 to the wafer washing/drying chamber 61 so that the wafer is contaminated with an organic matter such as carbon, dust, etc.

In the case where a wafer having a grooved pattern on its surface, such as a DRAM wafer having a trench capacitor as, for example, a memory cell's capacitor, is to be washed, a gas or vapor is readily forced into the grooves of the wafer. In the case where such grooved surface of the wafer is hydrophobic, pure water is hard to penetrate into the grooved surface during washing and it becomes difficult to replace a trapped gas or vapor in the grooves or trenches with the pure water.

There is a tendency that, with an increase in an element's capacity at a DRAM chip area of the DRAM wafer, the trench of the trench capacitor becomes smaller in its opening size and becomes deeper and that it becomes difficult to, at a washing process, wash the trench with pure water.

SUMMARY OF THE INVENTION

It is accordingly an object of the present invention to provided an apparatus for subjecting a semiconductor substrate to a washing process, which, after washing the semiconductor substrate with a chemicals solution for washing use, can wash it with pure water without any exposure to an outer atmosphere, can take up less mount space of a chamber, can prevent substrate contamination and, even if the substrate whose surface is grooved or trenched is to be washed with pure water, and can force the pure water readily into the grooves or trenches in the substrate surface.

In order to achieve the object of the present invention, there is provided an apparatus for subjecting a semiconductor substrate to a washing process, comprising: a hermetically closable, washing process chamber for substrate washing; a washing process bath provided in the washing process chamber to subject the semiconductor substrate to the washing process; a substrate support mechanism provided in the process chamber to support the semiconductor substrate in a horizontal state; a liquid supply mechanism for supplying a liquid at least enough great an amount to allow the semiconductor substrate to be immersed with the liquid; a chemicals component supply mechanism for supplying a chemicals liquid vapor and gas into the process chamber for a predetermined time period to allow the chemicals liquid vapor and gas to be dissolved into the liquid in the process bath to give a solution; and a pure water replacing mechanism for replacing, with a specific liquid, the solution in the process bath.

The apparatus of the present invention thus constructed can wash the substrate in a way to be immersed in the solution with the liquid chemicals vapor or gas dissolved therein. It is, therefore, possible to, even in the case where any metal particles are present in the substrate surface, remove them readily and, even in the case of the substrate having a grooved or trenched surface, to readily force the solution into the grooves in the substrate surface so that the substrate surface, being grooved or trenched, can be adequately washed with less chemicals liquid used.

Since the substrate, being washed with the solution, can be adequately washed with pure water without being exposed to the outer atmosphere, it is not necessary to convey the substrate from chamber to chamber as encountered in the conventional apparatus and prevent the substrate from being contaminated during conveyance. In the case where the substrate has any grooved surface, the pure water can readily enter into the grooves in the substrate surface upon washing with the pure water so that the even grooved surface of the substrate can readily be washed with an enhanced effect.

In the case where, for example, a DRAM wafer is to be washed, there is a tendency that, with the element capacity of the DRAM chip area increasing, the trench of the trench capacitor become smaller in its opening dimension and deeper. Even in this case, it is possible, according to the present invention, to readily wash the wafer with an enhanced effect.

Since the substrate can be washed with the solution and then the pure water in the same chamber, it is possible to take up less chamber mount space in comparison with the conventional apparatus using two kinds of chambers.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

An embodiment of the present invention will be explained below with reference to the accompanying drawings.

Figure 1:
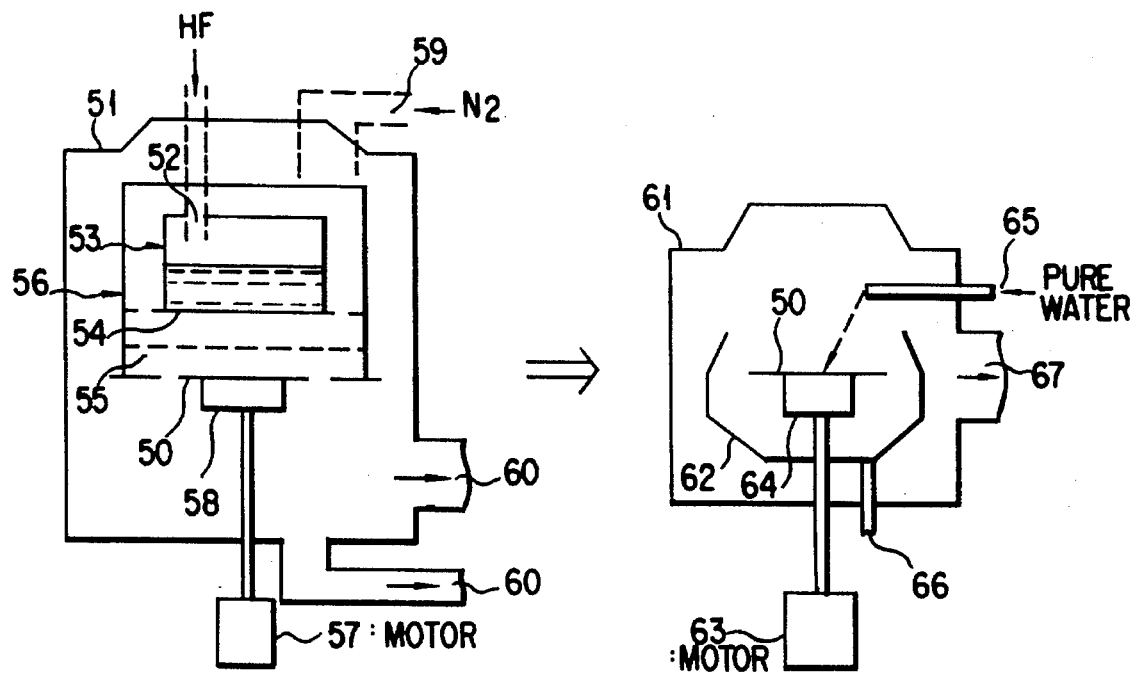
FIG. 1 is a cross-sectional view diagrammatically showing an arrangement of a conventional apparatus for washing a semiconductor substrate.
Figure 2:
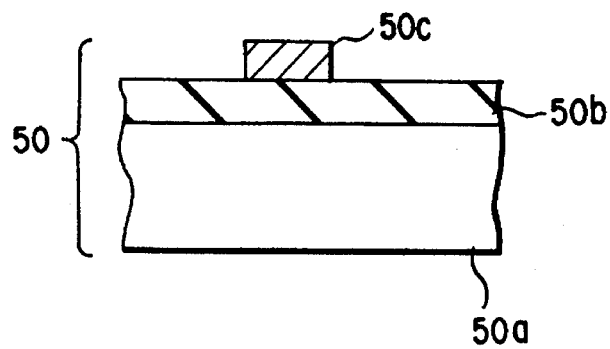
FIG. 2 is a cross-sectional view showing one form of a wafer washed by the apparatus of FIG. 1.
Figure 3:
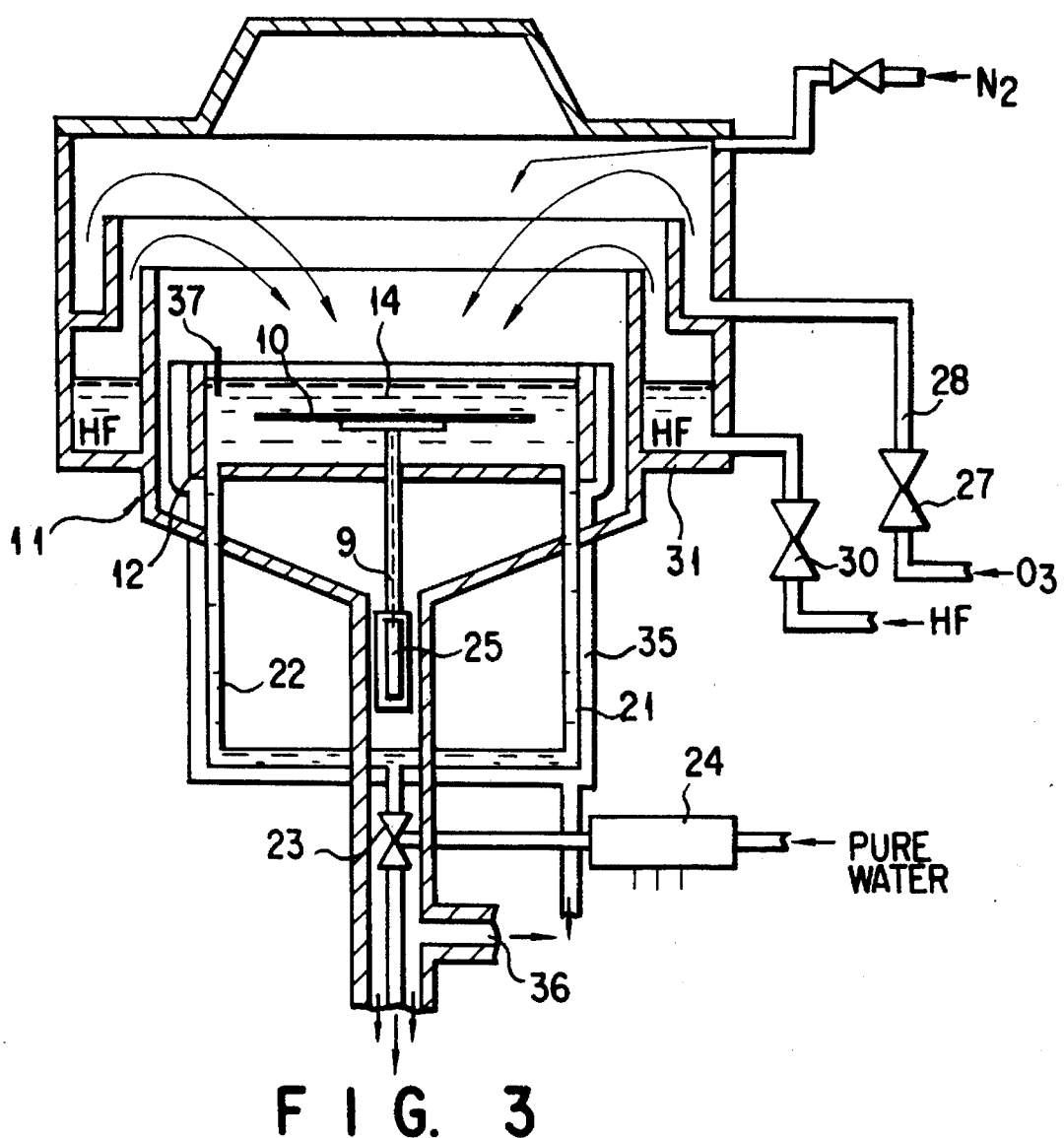
FIG. 3 is a cross-sectional view diagrammatically showing an apparatus, according to an embodiment of the present invention, for subjecting a semiconductor substrate to a washing process.
Figure 4:
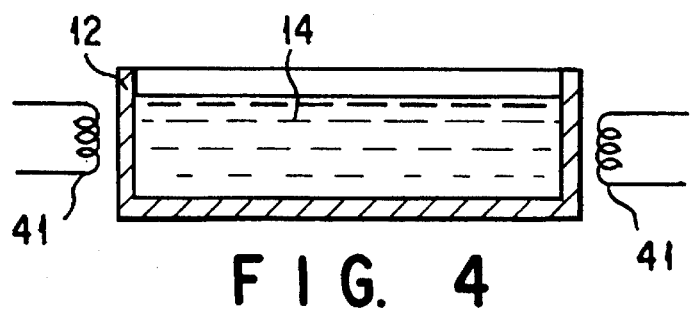
FIG. 4 is a cross-sectional view showing one form of a temperature control means for controlling temperature in a process bath in the apparatus of FIG. 3.

FIG. 3 is a view diagrammatically showing a semiconductor substrate washing apparatus according to the embodiment of the present invention.

The substrate washing apparatus includes a hermetically closable chamber 11 in which a washing process bath 12 is provided for subjecting a semiconductor substrate (hereinafter referred to as a wafer) to a washing process.

A substrate support mechanism 9 is provided within the washing process bath 12 to support a wafer 10 in a horizontal state. A liquid supply mechanism is provided in the washing process bath 12 to supply a liquid 14 therein in an amount at least enough great to immerse the supported wafer 10 therein. The liquid supply mechanism comprises a liquid/pure water supply source 24, a valve 23 and a pipe 21.

A chemicals component supply mechanism is provided for allowing the chemicals liquid vapor for semiconductor substrate washing to be supplied into the chamber 11 for a predetermined time period so that the chemicals liquid vapor is dissolved into the liquid in the washing process bath. The chemicals component liquid supply mechanism comprises a container 31 constituting a vapor supply means for supplying a vapor of the chemicals liquid (for example, HF) for substrate washing, a means for supplying ozone ($O_3$) from an outside into the chamber 11 via a valve 27 and ozone gas supply pipe 28 and a means for supplying an inert gas (for example, an $N_2$ gas) which is fed from an outside of the chamber 11 into the washing process bath 12 by a valve 33 and $N_2$ gas supplying pipe 34 to allow a vapor stream of the hydrofluoric acid (HF) to be created over the washing process bath 12. An exhaust outlet 36 is provided in the chamber 11.

A pure water replacing mechanism is provided for enabling a solution 14 with the chemicals vapor dissolved in the washing process bath to be replaced with pure water. The pure water replacing mechanism comprises a drain outlet 29 connected to the bottom of the chamber 11 to discharge the solution 14 after the washing of the wafer and a discharge pipe 35 which, after the solution 14 has been discharged via the drain outlet 29 subsequent to the washing of the wafer, fills the washing process bath 12 with pure water from the liquid/pure water supply source 24, so that the wafer 10 is washed with the pure water and the pure water overflowed from the washing process bath 12 is discharged. In this way, the wafer 10 is washed with the solution 14 and then the solution 14 is replaced with the pure water for washing.

The substrate support mechanism is so constructed that the substrate support base 9 for holding the wafer 10 in a horizontal state can be rotatably driven by a motor 25. This construction allows the wafer 10 which has been washed with the pure water to be spin-dried by the rotation of a motor 25.

The vapor supply means is of such a type that it can control an amount of hydrofluoric acid HF vapor supplied by adjusting temperature at the container 31, that is, a container to which the chemicals liquid is supplied by a valve 30 from the outside of the chamber 11.

In the washing of the wafer 10 with the hydrofluoric acid HF, the hydrofluoric acid HF vapor is supplied into the chamber 11 for a predetermined time period so that the hydrofluoric acid HF vapor is dissolvable into the liquid in the washing process bath to provide a solution above.

As the density measuring means use may be made of a conductivity meter 37 for measuring the conductivity of the solution 14 in which the hydrofluoric acid HF vapor or gas is dissolved or a PH meter for measuring the HF of a solution in which the chemicals vapor or gas is dissolved.

Further, an amount of oxide film etched by the hydrofluoric acid HF is governed depending upon the temperature of the solution and it is, therefore, necessary to control the temperature of the solution.

As one form of the temperature control means, a heater 41 may be arranged around the washing process bath 12 as shown in, for example, in FIG. 3, so that the temperature of the heater 41 may be controlled. It may be possible to control the temperature of a solution per se when the liquid is supplied into the washing process bath 12.

In the substrate washing apparatus of the present embodiment, it is possible to wash the wafer 10 in a state immersed in an HF vapor- and $O_3$ gas-dissolved solution 14 for wafer washing. Thereafter, the solution 14 in the washing process bath 12 is replaced with the pure water and, even in the case where metal particles are left on the surface of the wafer 10, they can be removed from the wafer surface. For the case of those wafers whose surfaces are grooved or trenched, the solution is readily forced into the grooves in the wafer surface so that it is possible to thoroughly wash the grooves or trenches in the wafer surface and hence to lessen an amount of chemicals (HF) liquid used. After the wafer has been washed with the solution 14, the wafer can be washed with the pure water without being exposed to the outer atmosphere. It is, therefore, not necessary to convey the wafer 10 from one chamber to another as in the conventional apparatus. It is, therefore, possible to prevent the wafer from being contaminated during conveyance. Even in the case of a wafer whose surface has a grooved or trenched pattern, the pure water readily enters into the groove or trench in the wafer surface upon washing so that it is easy to wash the wafer with the pure water.

Further, the semiconductor substrate can be washed, in the same chamber, with the solution and then with the pure water, thus taking up less mount space than in the conventional apparatus equipped with two binds of chambers.

Although, in the above-mentioned embodiment, the pure water has been used for a solution into which the vapor of the chemicals liquid is dissolved, the solution above is not restricted thereto and, in place of the above solution, use may be made of a water-added ozone solution.

The vapor generator may be omitted and, instead, a mixture of a water vapor and liquid chemicals gas may be fed from the outside of the chamber via a valve into the chamber for a predetermined time period so that the gaseous mixture may be dissolved into the process bath.

Although, in the above-mentioned embodiment, the HF vapor and $O_3$ gas have been explained as being dissolved into a liquid to give a solution, the present invention is not restricted thereto and use may be made of another dissolvable chemicals liquid (for example, $HNO_3$) vapor or a gas (for example, a Cl gas) to give such a solution.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. An apparatus for subjecting a semiconductor substrate to a washing process, comprising:

a hermetically closable, washing process chamber for substrate washing;

a washing process bath provided in the washing process chamber to subject the semiconductor substrate to the washing process;

a substrate support mechanism provided in the process chamber to support the semiconductor substrate in a horizontal state;

a liquid supply mechanism for supplying a liquid in an amount to allow the semiconductor substrate to be immersed with the liquid;

a chemicals component supply mechanism for supplying a chemicals liquid vapor and gas into the process chamber for a time period to allow the chemicals liquid vapor and gas to be dissolved into the liquid in the process bath to give a solution; and a pure water replacing mechanism for replacing, with a specific liquid, the solution in the process bath.

2. The apparatus according to claim 1, wherein the chemicals liquid consists of a hydrofluoric acid solution.

3. The apparatus according to claim 1, wherein the specific liquid consists of pure water.

4. The apparatus according to claim 1, wherein the specific liquid consists of a water-added ozone solution.

5. The apparatus according to claim 1, further comprising means for measuring a density in the chemicals component in the solution in the process bath and means for controlling a density in the solution on the basis of a result of measurement by the measuring means.

6. The apparatus according to claim 5, wherein the density controlling means is comprised of means for controlling temperature in the solution.

7. The apparatus according to claim 5, wherein the density controlling means is comprised of means for controlling an amount of liquid supplied into the process bath.

* * * * *